United States Patent [19]

Kunz

[11] Patent Number: 4,475,154
[45] Date of Patent: Oct. 2, 1984

[54] CIRCUIT FOR TRANSFERRING POSITION DATA IN A COMPUTER CONTROLLED DEVICE

[75] Inventor: Hans-Ulrich Kunz, Kollbrunn, Switzerland

[73] Assignee: Maag Gear-Wheel & Machine Company, Zurich, Switzerland

[21] Appl. No.: 340,495

[22] Filed: Jan. 18, 1982

[30] Foreign Application Priority Data

Feb. 3, 1981 [CH] Switzerland ............................ 691/81

[51] Int. Cl.³ ............................ G06F 7/38; G06M 3/14
[52] U.S. Cl. .................................... 364/167; 364/200; 364/900; 364/184; 377/17
[58] Field of Search ............... 364/167, 168, 169, 170, 364/171, 200 MS File, 900 MS File; 377/17, 3

[56] References Cited

U.S. PATENT DOCUMENTS 3,396,371 8/1968 Waldecker .......................... 364/200
4,079,235 3/1978 Froyd et al. ...................... 364/169 X
4,225,931 9/1980 Schwefel ................................. 377/3
4,229,646 10/1980 Burkhardt et al. ...................... 377/3

OTHER PUBLICATIONS

*Data Processing and Computer Programming,* Cashman et al., Canfield Press, Harper and Row, N.Y., 1971, pp. 227-229.

*Computer Dictionary and Handbook,* 3rd Ed., Sippl et al., Howard W. Sims and Co. Inc., Ind, 1980, p. 542.

*Primary Examiner*—Joseph F. Ruggiero
*Assistant Examiner*—Allen MacDonald
*Attorney, Agent, or Firm*—Werner W. Kleeman

[57] ABSTRACT

A circuit for transferring measured values from an incremental position measuring system wherein the analogue output signals of this incremental position measuring system are digitized and transferred via a counter to a computer which delivers them to an evaluation device. Between the counter and the computer there is provided an intermediate storage in order to avoid that the computer receives instable data during the processing time of the counter between two events, during which the counter passes from one counter state to the next one. By means of a synchronization circuit the computer controls the intermediate storage according to a priority sequence and such that this intermediate storage only reads counter states from the counter during time intervals which are greater than the processing time of the counter or at least equal thereto. Therefore, the computer equally only transmits stable data which can be employed, for instance, at a processing or measuring machine for a high-precision position regulation.

3 Claims, 3 Drawing Figures

CIRCUIT FOR TRANSFERRING POSITION DATA IN A COMPUTER CONTROLLED DEVICE

BACKGROUND OF THE INVENTION

The present invention relates to a new and improved circuit for transferring measured values from an incremental position measuring system, the analogue output signals of which are digitized and transferred via a counter to a computer which transmits them to an evaluation device.

With a prior art circuit of this general type, as disclosed in U.S. Pat. No. 4,229,646, granted Oct. 21, 1980 the position measuring system is formed by a scale and a scanning head, and by an electronic up-down or forward-backward counter. This position measuring system serves for measuring or positioning the relative location or orientation of two objects which can be, for instance, the carriage and the bed, respectively, of a processing or measuring machine. The analogue output signals delivered by the scanning head are first converted into square-wave pulse-shaped digital signals and then transferred to the counter. The counter is connected to a digital computer which compares the counted values with values received from a reference or set point storage and transmits the difference to a display or indicator device. This display or indicator device is read by an operator who either checks by means of the display whether or not the relevant machine has reached the desired position, or else the operator manually intervenes in the positioning operation upon reading the displayed result.

According to a further prior art circuit of similar construction, as disclosed in U.S. Pat. No. 4,225,931, granted Sept. 30, 1980, the computer serves for calculating interpolation values for performing a further division within a signal period, i.e. for achieving smaller digital steps.

These prior art circuits can only be used in connection with the aforedescribed display device and equally are only provided for this purpose. It would not be possible to input the values which have been delivered by the computer directly to a servo mechanism of a processing machine or the like, since in such case the slightest false information, which results from the finite processing time of the counter, is not permissible. With the prior art circuit the display or indicator device is read by the human eye, which, if the signal scanning rate is of sufficient magnitude, cannot detect faulty displays at all because the display or indicator device always shows a stable value. However, there may in fact be present between two displayed values signal surges or jumps. These signal surges could render unstable the regulation and cause such regulation which is performed by a servomechanism to oscillate or hunt. If, with the prior art circuits, the counter has a certain counter state as a result of a preceding event and there now occurs a further event, then the counter needs a finite period of time for counting forwards or backwards to the new counter state which corresponds to this new event. This finite period of time may be in the order of 600 to 800 ns. During this time, the count or output state of the counter is unstable. With prior art circuits this does not constitute a disadvantage because the human eye averages the display shown at the display or indicator device. Since such possibility does not and must not exist if the computer output data is delivered to a servomechanism rather than to a display or indicator device, the prior art circuits cannot be used in this case.

SUMMARY OF THE INVENTION

Therefore, it is a primary object of the present invention to provide a new and improved construction of a circuit of the initially mentioned type, which is not associated with the aforementioned limitations and shortcomings of the prior art circuitry.

Another important object of the present invention is to provide a new and improved construction of a circuit of the initially mentioned type, wherein the computer only receives at any given time stable counter states from the counter.

Now in order to implement these objects and others which will become more readily apparent as the description proceeds the invention contemplates arranging an intermediate storage or buffer register between the counter and the computer. By means of a synchronization circuit the computer controls the intermediate storage according to priority such that this intermediate storage only receives counter states from the counter in time intervals which are greater than the processing time of the counter or at least equal thereto.

While with the circuit according to the invention there equally are detected events which occur at the positioning system and which events are counted by the counter and processed by the computer, however there is obtained by means of the synchronization circuit and the intermediate storage a timewise synchronization of the counted events and the processed events. This synchronization is accomplished in that the intermediate storage and the synchronization circuit appropriately control the signal and data traffic.

If there is detected with the circuit according to the invention an event which is to be counted by the counter, the latter equally needs time for processing this event. During this period of time, the output signals of the counter are not stable, i.e. not reliable, because they can assume any value and the correct counter state only will be established upon termination of the processing time needed by the counter. Only after the processing time of the counter is the counted data loaded into the intermediate storage which is controlled by the synchronization circuit and thus only stable data is rendered available to the computer at any time. However, by means of the computer and the synchronization circuit a priority sequence at the intermediate storage is established. The computer is given the highest priority i.e. when it needs to read data it reads such out from the intermediate storage. During the time of such data readout, no data can be transferred from the counter to the intermediate storage. If during this read operation there has been detected an event to be counted, the computer does not retrieve such actual event from the intermediate storage but continues to retrieve the preceding event which is still stored therein, because the actual event cannot be transferred to the intermediate storage during the time of this read operation. Thus, although the computer at that moment does not receive the actual counter state from the intermediate storage, the counter state which is received nonetheless is precise, i.e. stable.

According to the invention the circuit can be designed such that the signal inputs of the synchronization circuit are connected with the inputs of the counter. The control inputs of the synchronization circuit are connected with the computer and there are received therefrom continuously scanning or sampling signals and, as required, read signals. The output of the synchronization circuit is connected with the control input of the intermediate storage and the priority of the computer is determined such that upon appearance of a read signal there is inhibited the data transfer between the counter and the intermediate storage and the value present in the intermediate storage is transferred to the computer. With this arrangement the control of the synchronization circuit by the computer is accomplished by means of sampling or scanning signals. The frequency of these sampling or scanning signals is a predetermined multiple or sub-multiple of the computer clock frequency. As soon as there appears a scanning signal, whose individual pulses have a timewise spacing from one another which is greater than the processing time of the counter or equal thereto, then a counter state can be transferred from the intermediate storage to the computer, or a counter state can be transferred from the counter to the intermediate storage, respectively, depending upon whether the computer and thus the synchronization circuit transmits a read signal to the intermediate storage or whether the synchronization circuit transmits a signal LOAD and STORE to the intermediate storage. The priority is chosen such that there is always given preference to the read-out of data by means of the computer from the intermediate storage. A further priority is selected such that the most recent counter state, as soon as it is stable, always is immediately transferred from the counter to the intermediate storage, as long as the computer does not indicate, by supplying a read signal, that it wishes to retrieve data from the intermediate storage. The third condition which is controlled by the synchronization circuit consists in that the latest counter state remains stored in the intermediate storage for as long as the position regulation system does not detect a further event and the computer does not wish to read data.

BRIEF DESCRIPTION OF THE DRAWINGS

The invention will be better understood and objects other than those set forth above will become apparent when consideration is given to the following detailed description thereof. Such description makes reference to the annexed drawings which depict an exemplary embodiment of the invention and wherein.

DETAILED DESCRIPTION OF THE PREFERRED EMBODIMENTS

Figure 1:
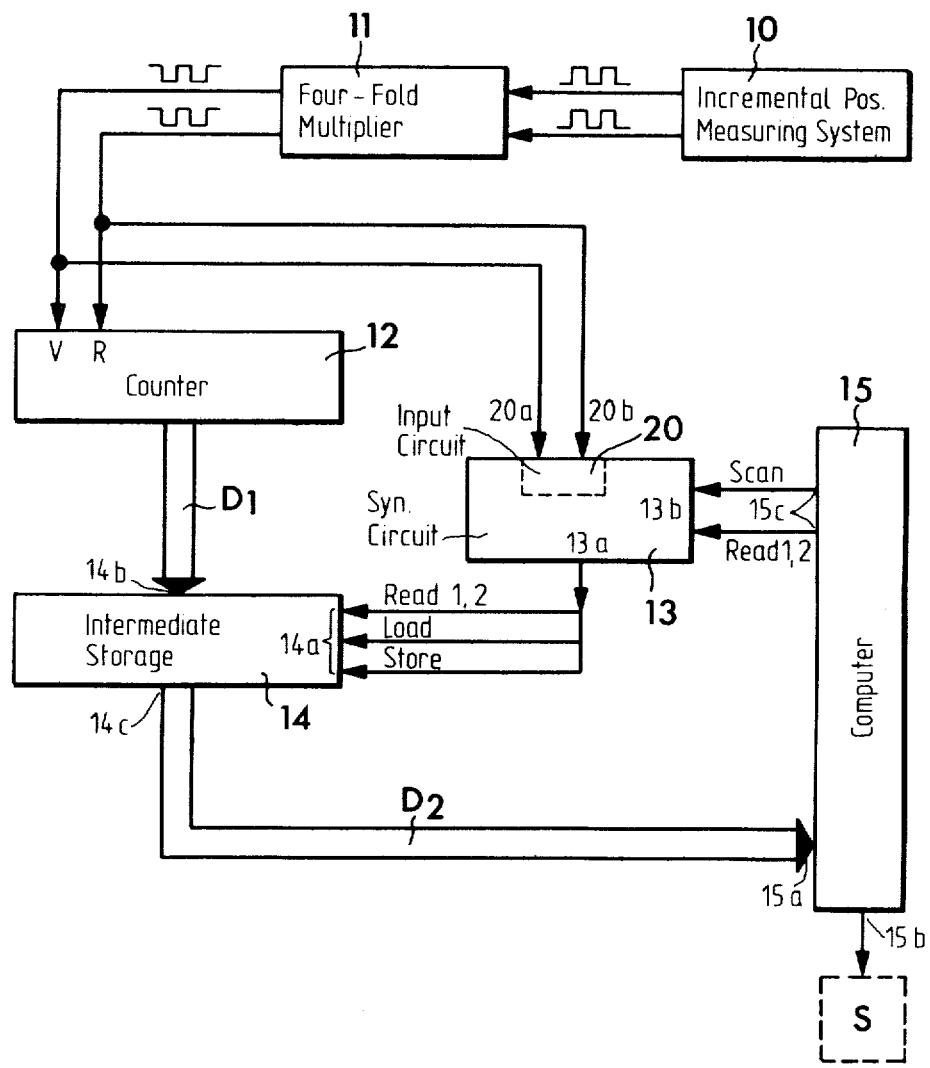
FIG. 1 is a block circuit diagram of the circuit according to the invention.

According to FIG. 1 analogue measured values of any suitable incremental position measuring system 10, which after having been digitized by conventional and therefore here not further illustrated devices, are applied to the inputs V, R of an up-down or forward-backward counter 12 via a conventional quadruplicator or four-fold multiplier 11, which as concerns the required precision ensures that its output signals have the four-fold or quadruple frequency of the input signals. These digital input signals correspond to the events which have been detected by the position measuring system 10 and which are to be counted by the counter 12. The counter inputs V and R are connected to the signal inputs 20a and 20b, respectively, of an input circuit 20 of a synchronization circuit 13. The output 13a of the synchronization circuit 13 is connected to the control input or input means 14a of an intermediate storage 14. The data output of the counter 12 is connected via a data bus D1 to the data input 14b of the intermediate storage 14. The data output 14c of the intermediate storage 14 is connected via a further data bus D2 to an input 15a of a computer 15, whose output 15b is connected to an evaluation device S, for instance a servomechanism. The control signal inputs 13b of the synchronization circuit 13 are connected to the output or output means 15c of the computer 15.

The date bus D1 can be, for instance, a 32-bit bus, while the further data bus D2 can be, for instance, a 16-bit bus.

The computer 15 constantly transmits sample or scanning signals (SCAN) to the synchronization circuit 13. The clock frequency of these scanning signals is in a certain relationship to the clock frequency of the computer 15 and forms the master or pilot frequency for the processing of signals, data and computer commands in the circuit. The timewise spacing T between the individual pulses of the scanning signal is a predetermined multiple or sub-multiple of the counter clock time $T_R$ and is selected so as to be greater or equal to the processing time of the counter 12, as will be seen by referring to the upper left-hand portion of FIG. 3, which will be explained in greater detail hereinafter. The processing time of the counter 12 is the time which the counter 12 needs for reestablishing a stable value at its output after the arrival of an event which has been detected by the position measuring system 10 and which has triggered an up-down or forward-backward counting process in the counter 12. This processing time can be found in data books or manufacturer's specifications. If, according to the counter clock time $T_R$ indicated in FIG. 3, the computer clock frequency amounts, for instance, to 4 MHz, then the length $t_T$ of a scanning signal pulse, for instance, can be 30 ns and the time T between two scanning signal pulses, for instance, can be equal to the time between two counter clock pulses, as indicated in the drawing.

As required, the computer 15 furthermore supplies signals READ 1, READ 2 to the synchronization circuit 13, whereupon the counter states, which are stored in the intermediate storage 14, are transferred to the computer 15 via the data bus D2 in the form of data quanta or words 1 and 2.

For controlling the data traffic, i.e. data collection in the counter 12, the transfer of the data from the counter 12 to the intermediate storage 14 and the data transfer from the intermediate storage 14 to the computer 15, the synchronization circuit 13 controls the following conditions by means of the signals READ 1, 2, LOAD and STORE, which occur at the output 13a of the synchronization circuit 13:

(1) READ 1 and READ 2 are reading signals, which have ascribed thereto the highest priority and cause the intermediate storage or data buffer 14 to transfer the data, which is stored therein, in two quanta or data words 1 and 2 to the computer 15.

(2) The signal LOAD causes the counter state of counter 12 to be loaded into the intermediate storage or data buffer 14 via the data bus D1.

(3) The signal STORE causes the counter state which momentarily is contained in the intermediate storage 14 to be maintained.

The aforedescribed conditions, which are controlled by means of the output signals of the synchronization circuit 13, are linked to the following conditions:

Condition 1:
It is necessary that the reading signal READ 1 or READ 2 is available from the computer 15. If this is so, the intermediate storage 14 can be read, i.e. it transfers its stored data to the computer 15.

Condition 2:
Loading of the intermediate storage 14 with the data of the counter 12 occurs under the following conditions:
the event to be counted has been detected by the synchronization circuit 13 via the inputs 20a and 20b;
the processing time for counting this event at the counter 12 has expired;
there is not present a signal READ 1 or READ 2 from the computer;
the reading operation has been terminated;
there is present a signal SCAN from the computer.

Condition 3:
The counter state is kept stored in the intermediate storage 14 under the condition that:
the current supply of the synchronization circuit is switched-on; and
the reading operation has not been terminated.

Figure 2:
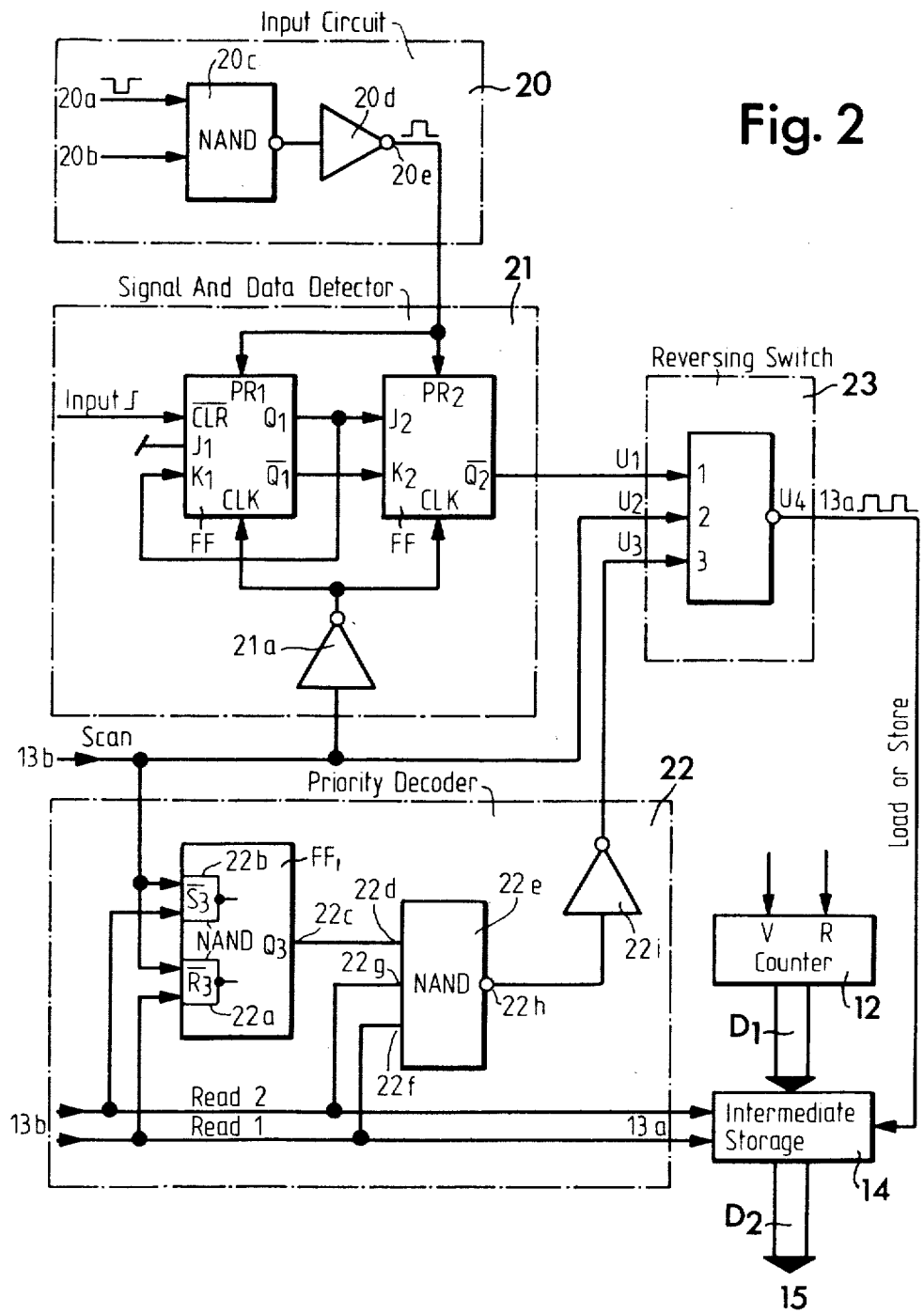
FIG. 2 illustrates the construction of the synchronization circuit and the connection thereof to the intermediate storage and to the computer.

In FIG. 2 there are illustrated in addition to the counter 12 and the intermediate storage 14, which again are represented in the form of a block circuit diagram, in greater detail the essential circuit elements which form the synchronization circuit 13, i.e. the input circuit 20, a signal and data detector 21, a priority decoder 22 and a reversing switch 23. These elements are commercially available circuit elements which are mutually interconnected in the manner illustrated in FIG. 2 and the mode of operation and the cooperation of which will be better understood hereinafter when there will be described the diagram of FIG. 3. According to FIG. 2 the input circuit 20 is composed of a NAND-gate 20c which is provided with a subsequently arranged inverter 20d. The signal and data detector 21 is formed by JK-flip-flops FF. Each preset or setting input PR1 and PR2, respectively, of these JK-flip-flops FF is connected to the output 20e of the inverter 20d of the input circuit 20, while each of the clock inputs CLK thereof receives via an inverter 21a the signal SCAN. The priority decoder 22 contains an $\overline{SR}$-flip-flop $FF_1$. The inputs of this $\overline{SR}$flip-flop $FF_1$ are formed by two NAND-gates 22a and 22b and receive the signals SCAN and READ 1 or SCAN and READ 2, respectively, while the output 22c thereof is connected to the input 22d of a NAND-gate 22e, which at two further inputs 22f and 22g receives the signals READ 1 and READ 2, respectively. The output 22h of this NAND-gate 22e is connected via an inverter 22i to the input 3 of the reversing switch 23 for delivering thereto an input signal U3. For receiving the signals U1 and U2, respectively, the two further inputs 1 and 2 of the reversing switch 23 are respectively connected to the output of the signal and data detector 21 and to the output of the computer 15 which delivers the scanning signal. The output of the reversing switch 23, through which the same delivers the signal U4, i.e. the signal LOAD or STORE, is connected to the intermediate storage 14.

At this point there will be described the mode of operation of the circuit arrangement illustrated in FIG. 2.

When the incremental measuring system 10 has detected an event to be counted and there thus appears at least one of the input signals at the inputs 20a and 20b of the input circuit 20, then the NAND-gate 20c of the input circuit 20 supplies a signal to the inverter 20d thereof. The inverter 20d inverts this signal and applies it to the preset inputs PR1 and PR2 of the flip-flops FF of the signal and data detector 21, whereby the output $\overline{Q}_2$ thereof is set to the signal value or logic state 0. Prior thereto, the signal and data detector 21 had been set into the reset condition or state by means of the input CLR. The clock input CLK of the signal and data detector 21 is controlled by the scanning signal. As long as the signal U1 at the output $\overline{Q}_2$ has the logic value 1, this then is an indication that events to be counted have been processed in the counter 12 and are ready for transfer to the intermediate storage 14, i.e. the intermediate storage 14 can be loaded.

Figure 3:
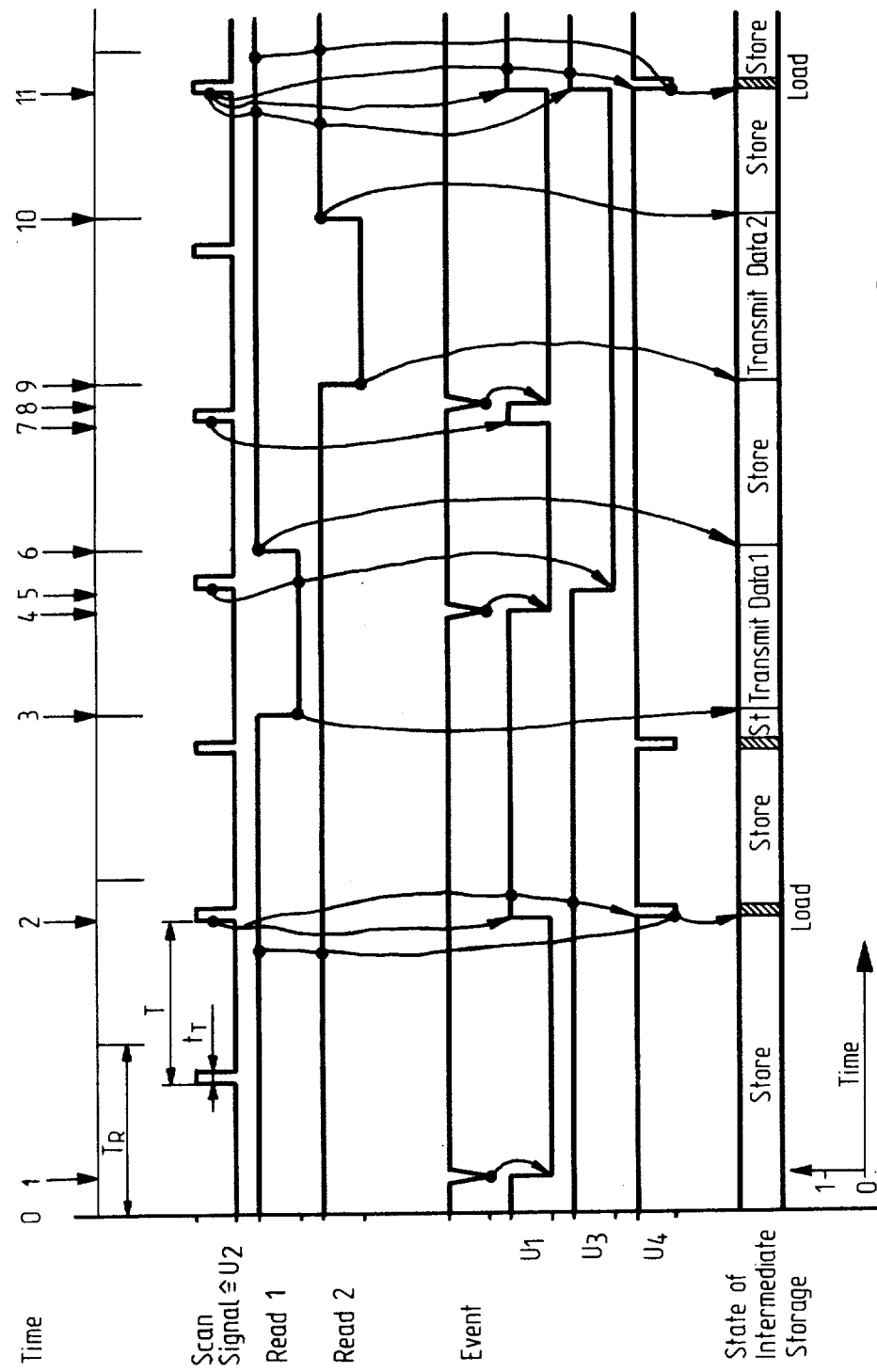
FIG. 3 is a time diagram for explaining the mode of operation of the synchronization circuit.

The priority decoder 22 receives from the computer 15 the signals SCAN, READ 1, READ 2 and as a function thereof transmits the output signal U3, as also will best be seen by referring to FIG. 3. By means of the signal READ 1 the computer 15 gives the command to read a data quantum or word 1, for instance a 16-bit data word, out of the intermediate storage 14. By means of the signal READ 2 the computer 15 gives the command to read out a data quantum 2 from the intermediate storage 14 and thereafter terminates the reading process. If the output signal U3 of the priority decoder 22 has the signal value or logic state 0, this means that the operation with the highest priority is being carried out, i.e. the intermediate storage 14 is being read and transmits a data quantum 1 or a data quantum 2 to the computer 15 (cf. "Transmit Data 1" and "Transmit Data 2" in FIG. 3).

At its input 1 the reversing switch 23 receives the signal U1 from the signal and data detector 21. When the signal U1 has the logic value 1 detected event is ready to be processed, while no event is ready to be processed when this signal U1 has the logic value or state 0. The signal U2, which appears at the input 2 of the reversing switch 23 and constitutes the scanning signal, controls the execution or performance time of the processing operation. When the output signal U4 of the reversing switch 23 has the signal state or value 0, then the counter state of the counter 12 should be loaded into the intermediate storage 14. When this output signal U4 has the logic state or value 1, this then means that the intermediate storage 14 is in the operating mode STORE or READ.

The mode of operation of the circuit arrangement illustrated in FIG. 2 will be explained hereinafter by means of the explanatory diagram of FIG. 3.

It is assumed that at the starting time 0 the counter 12 has the counter state N, the intermediate storage 14 has the same content as the counter 12, i.e. N, and the signals READ 1, READ 2, U1, U3 and U4 assume the signal value or logic state 1. There thus exist the following conditions at distinct moments of time as listed hereinbelow and as indicated by arrows at the top of FIG. 3:

Time 1:
There occurs an event, for instance a counting pulse "count forwards". The signal at the output $\overline{Q}_2$, which is equal to the input signal U1 of the reversing switch 23, is set to the value 0. This indicates that the data outputs of the counter 12 are not stable because the new or inbound event first has to be processed. The intermediate storage 14 therefore remains in the condition STORE, i.e. it maintains the stored counter state N and its outputs are inactive.

Time 2:

The counter 12 has processed the event, i.e. its now present counter state N+1 is ready to be transferred. The signal U1 thus assumes the signal value 1 and by means of the scanning signal, which is equal to the signal U2, the counter state thus is loaded from the counter 12 into the intermediate storage 14. The intermediate storage 14 now has stored the actual counter state, i.e. N+1.

Time 3:

By means of the signal READ 1, which has the signal value or state 0, the computer 15 now initiates the reading operation. The intermediate storage 14 transmits the data quantum 1 to the computer 15.

Time 4:

There occurs a further event, for instance a counting pulse "count forwards". The signal U1 is set to the value or logic state 0, which is the beginning of the processing time of the counter 12.

Time 5:

The scanning signal sets the signal U3 to the signal value or state 0 and ensures priority for the operation "read intermediate storage". This means that starting from time 5 the data in the intermediate storage 14 is not altered until it has been entirely transferred from the intermediate storage 14 to the computer 15 (cf. time period 11).

Time 6:

There has been terminated the operation of sending the data quantum 1, i.e. the transfer thereof from the intermediate storage 14 to the computer 15 has been completed, and the signal READ 1, which now has the signal value 1, switches the intermediate storage to the condition STORE, so that the outputs thereof are inactive.

Time 7:

By means of the scanning signal the signal U1 is set to the signal value or logic state 1, which again means that stable data is kept ready by the counter 12. However, since the signal U3 (read intermediate storage) still has the signal value or logic state 0 because the reading operation has not yet been terminated, the content of the intermediate storage 14 is not altered, i.e. the counter state is N+2 and the content of the intermediate storage is N+1.

Time 8:

There occurs a further event, for instance a counting pulse "count backwards". The signal U1 is set to the signal value or state 0.

Time 9:

The signal READ 2 assumes the signal value or state 0 and the intermediate storage 14 sends the second data quantum to the computer 15.

Time 10:

The signal READ 2 assumes the signal value or state 1 and sets the intermediate storage 14 into the condition STORE, whereupon the outputs of the intermediate storage 14 are inactive. At this point the reading operation of the computer 15 is terminated.

Time 11:

(a) The counter 12 has processed the event (time 8). The counter content N+1+1=1+'N+1 is ready for transfer and the signal U1 has the signal value or state 1.

(b) Since the reading operation (time 3 to 10) has been terminated by the computer 15 and there is not present a new reading command from the computer 15, i.e. the signal READ 1 and READ 2 have the signal value or state 1, the priority prerequisite or claim "read intermediate storage" is annihilated and the signal U3 is set to the signal value or state 1.

(c) There is performed the data transfer from the counter 12 to the intermediate storage 14. This intermediate storage 14 now contains the actual counter state N+1+1=1+N+1.

While there have been shown and described present preferred embodiments of the invention, it is to be distinctly understood that the invention is not limited thereto but may be embodied and practiced within the scope of the following claims. Accordingly,

What I claim is:

1. In a circuit arrangement for transferring measured values from an incremental position measuring system, of which the analogue output signals are digitized and transferred via a counter to a computer which transmits them to an evaluation device, the improvement which comprises:

an intermediate storage arranged between the counter and the computer;

synchronization circuit means operatively connected with the intermediate storage and the computer;

said digitized signals of the incremental position measuring system being transferred simultaneously to the counter and to said synchronization circuit;

said computer controlling said intermediate storage according to a priority sequence and such that said intermediate storage only receives counter states from said counter at time intervals which are greater or at least equal to the processing time of said counter.

2. The circuit arrangement as defined in claim 1, wherein:

said counter possesses inputs;

said synchronization circuit means possessing signal inputs and control inputs and an output;

the signal inputs of said synchronization circuit means being connected to the inputs of said counter for receiving said digitized signals of the incremental position measuring system simultaneously with the counter;

the control inputs of said synchronization circuit means being connected to said computer to provide said operative connection between said synchronization circuit means and said computer;

said control inputs constantly receiving from said computer scanning signals and read-out signals;

said intermediate storage possessing control input means;

the output of said synchronization circuit means being connected to said control input means of said intermeidate storage to provide said operative connection between said synchronization circuit means and said intermediate storage; and said computer determining said priority sequence such that upon appearance of a read-out signal the data transfer between said counter and said intermediate storage is inhibited and said counter state, which at that time is contained in said intermediate storage, is transferred from said intermediate storage to said computer.

3. In a circuit arrangement for transferring measuring values from an incremental position measuring system, of which the analogue output signals are digitized and transferred via a counter to a computer, the improvement which comprises:

an intermediate storage arranged between the counter and the computer;

synchronization circuit means operatively connected with the intermediate storage and the computer;

said digitized signals of the incremental position measuring system being transferred simultaneously to the counter and to said synchronization circuit means;

said computer controlling said intermediate storage by means of said synchronization circuit means;

said computer controlling said intermediate storage according to a priority sequence and such that said intermediate storage only receives counter states from said counter at time intervals which are greater or at least equal to the processing time of said counter;

a servo mechanism; and said computer having an output operatively connected to said servo mechanism to control the latter in accordance with said measured values transferred to said computer.

* * * * *

UNITED STATES PATENT AND TRADEMARK OFFICE
CERTIFICATE OF CORRECTION

PATENT NO. : 4,475,154
DATED : October 2, 1984
INVENTOR(S) : Hans-Ulrich KUNZ

It is certified that error appears in the above—identified patent and that said Letters Patent is hereby corrected as shown below:

Column 6, line 41, after "value 1" please insert --a--

Column 7, line 68 (last line), please delete "N+1+1=1+'N+1" and insert --N+1+1-1=N+1--

Column 8, line 14, please delete "N+1+1=1 +N+1" and insert --N+1+1-1=N+1--

Column 8, line 61, at the beginning of the line please delete "intermeidate" and insert --intermediate--

Signed and Sealed this

Twelfth Day of March 1985

[SEAL]

Attest:

DONALD J. QUIGG

*Attesting Officer*     *Acting Commissioner of Patents and Trademarks*